(12) United States Patent
Matsumoto et al.

(10) Patent No.: US 6,566,742 B1
(45) Date of Patent: May 20, 2003

(54) STRUCTURE FOR MOUNTING COMPONENTS

(75) Inventors: Masahiro Matsumoto, Hitachi (JP); Seikou Suzuki, Hitachioota (JP); Masayuki Miki, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/722,530

(22) Filed: Nov. 28, 2000

Related U.S. Application Data

(62) Division of application No. 08/778,538, filed on Jan. 3, 1997, now Pat. No. 6,305,223, which is a continuation of application No. 08/361,657, filed on Dec. 22, 1994, now abandoned.

(30) Foreign Application Priority Data

Dec. 27, 1993 (JP) ................................................ 5-331040

(51) Int. Cl.⁷ ........................ H01L 23/02; H01L 23/12; H01L 23/06
(52) U.S. Cl. ...................... 257/678; 257/704; 257/729; 257/699
(58) Field of Search ................................ 257/678, 723, 257/704, 684, 729, 703, 705, 699, 573, 602, 31.106, 31.119

(56) References Cited

U.S. PATENT DOCUMENTS

| | | | | |
|---|---|---|---|---|
| 4,164,263 A | | 8/1979 | Heintz et al. ................. 280/735 |
| 4,679,434 A | | 7/1987 | Stewart ...................... 73/517 B |
| 4,835,067 A | | 5/1989 | Levine ........................ 428/669 |
| 5,095,752 A | | 3/1992 | Suzuki et al. ............. 73/517 R |
| 5,233,871 A | * | 8/1993 | Schwarz et al. ............... 73/493 |
| 5,239,871 A | | 8/1993 | Reidemeister et al. .... 73/517 R |
| 5,241,133 A | * | 8/1993 | Mullen, III et al. ........ 174/52.4 |
| 5,253,526 A | | 10/1993 | Omura et al. ............. 73/517 R |
| 5,285,097 A | | 2/1994 | Hirai .......................... 257/417 |
| 5,394,011 A | * | 2/1995 | Yamamoto et al. ......... 257/693 |
| 5,417,312 A | | 5/1995 | Tsuchitani et al. .......... 180/181 |
| 5,503,016 A | | 4/1996 | Koen .......................... 73/493 |
| 5,535,626 A | | 7/1996 | Bullis et al. ............. 73/514.32 |
| 5,548,999 A | * | 8/1996 | Kakizaki et al. ............... 73/493 |
| 5,554,806 A | | 9/1996 | Mizuno et al. ................. 73/49 |
| 5,747,874 A | | 5/1998 | Seki et al. ................... 257/686 |
| 5,898,218 A | | 4/1999 | Hirose et al. ................ 257/710 |
| 5,901,046 A | | 5/1999 | Ohta et al. ................... 361/760 |

FOREIGN PATENT DOCUMENTS

| | | | |
|---|---|---|---|
| DE | 2720484 | 11/1977 | |
| EP | 369352 | 5/1990 | |
| EP | 557917 | 9/1993 | |
| FR | 2689642 | 10/1993 | |
| JP | 60-7740 | * 1/1985 | |
| JP | 3-11653 | * 1/1991 | |
| JP | 4312006 | 11/1992 | ............ H03H/3/08 |
| JP | 5288768 | 11/1993 | ............ G01P/15/09 |
| JP | 5-333056 | * 12/1993 | .................. 73/488 |

* cited by examiner

Primary Examiner—Jasmine J B Clark
(74) Attorney, Agent, or Firm—Antonelli, Terry, Stout & Kraus, LLP

(57) ABSTRACT

An acceleration sensor is disclosed which includes a capacitance-type acceleration detection element mounted on a ceramic base plate. The element comprises a movable electrode mounted between a pair of fixed electrodes. Acceleration of the sensor in a measurement direction causes the movable electrode to move relative to the fixed electrodes and the element has opposite ends in a direction perpendicular to the measurement direction. The acceleration detection element is mounted on the base at a first one of the opposite ends. Accordingly, the mounting surface of the acceleration sensor is parallel to the direction of acceleration to be detected. Thus the acceleration sensor can be surface-mounted on a printed board, and more be easily mounted in an automobile air bag control system or the like.

10 Claims, 8 Drawing Sheets

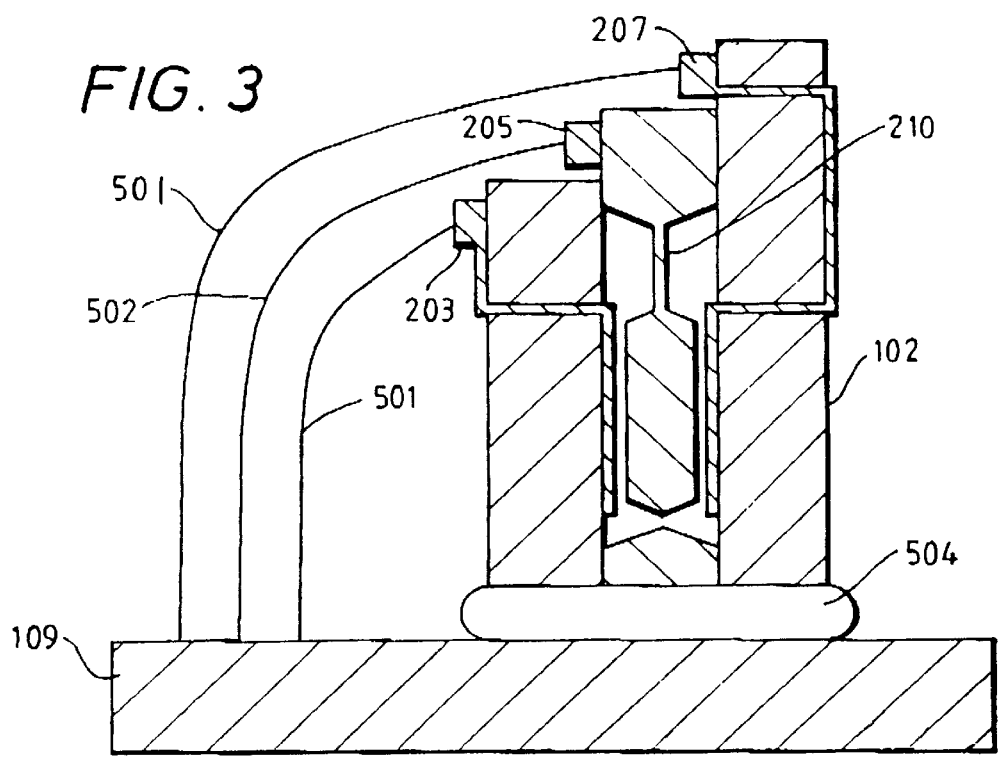
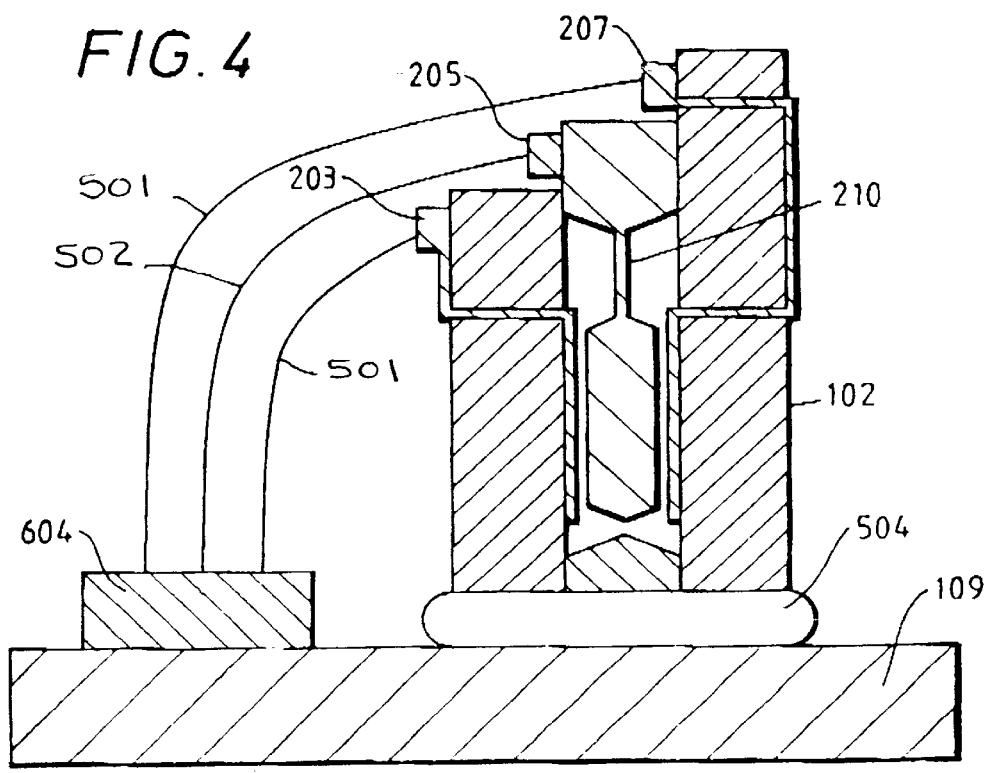

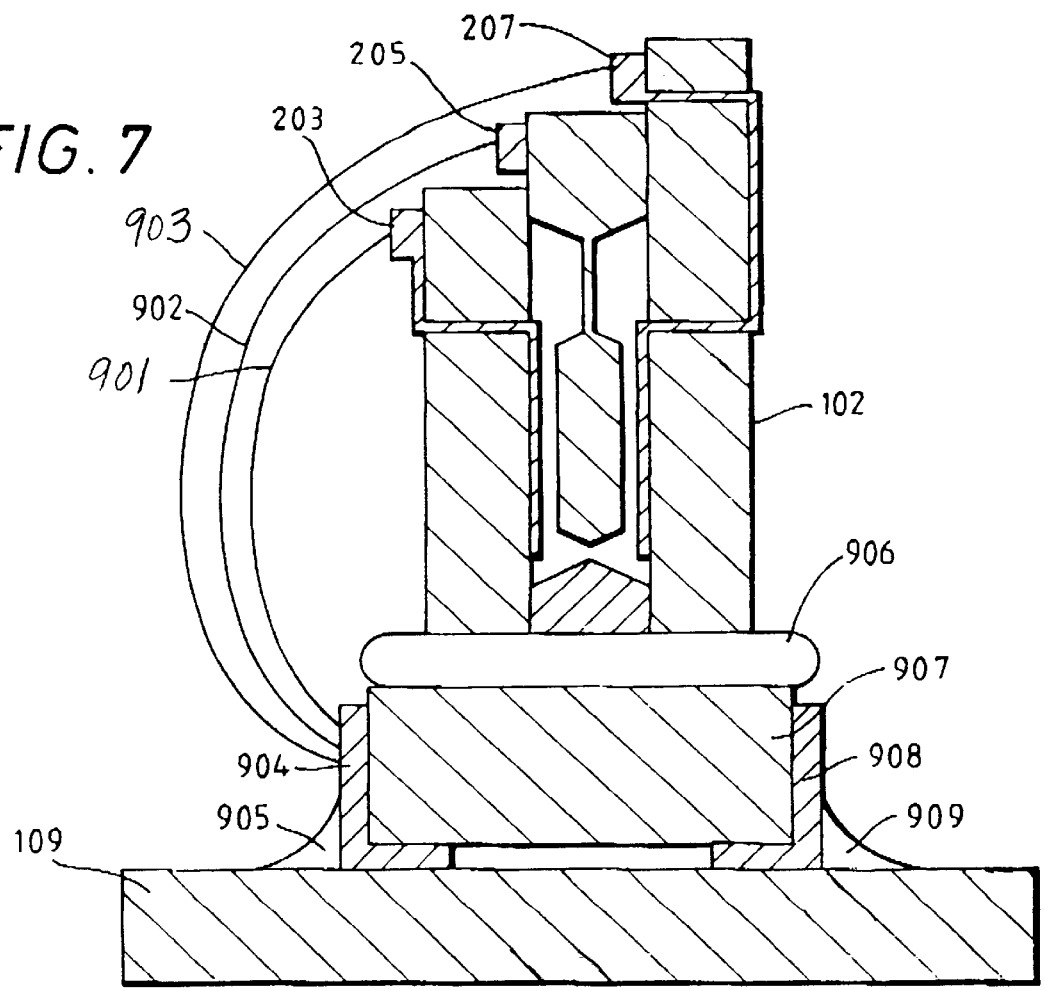
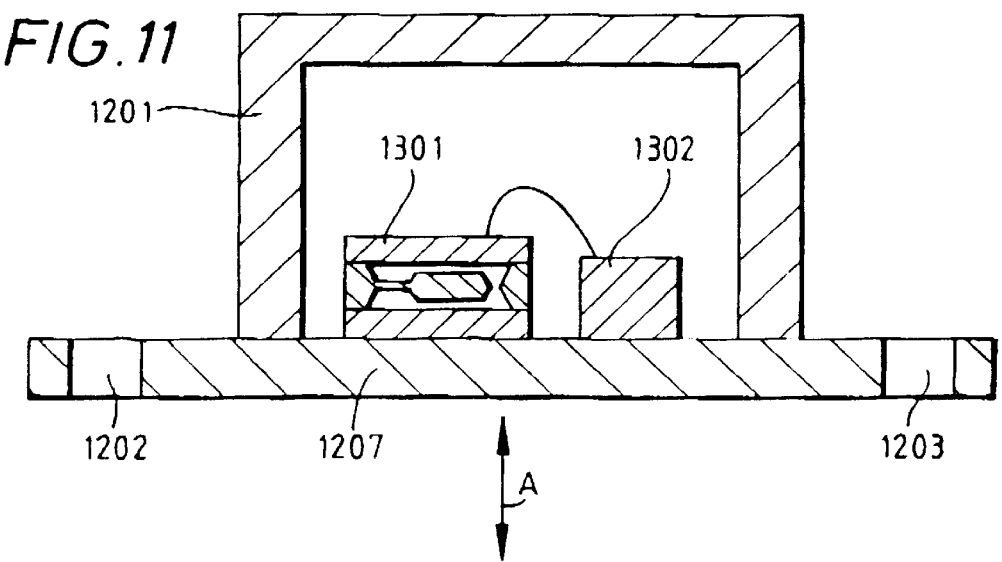

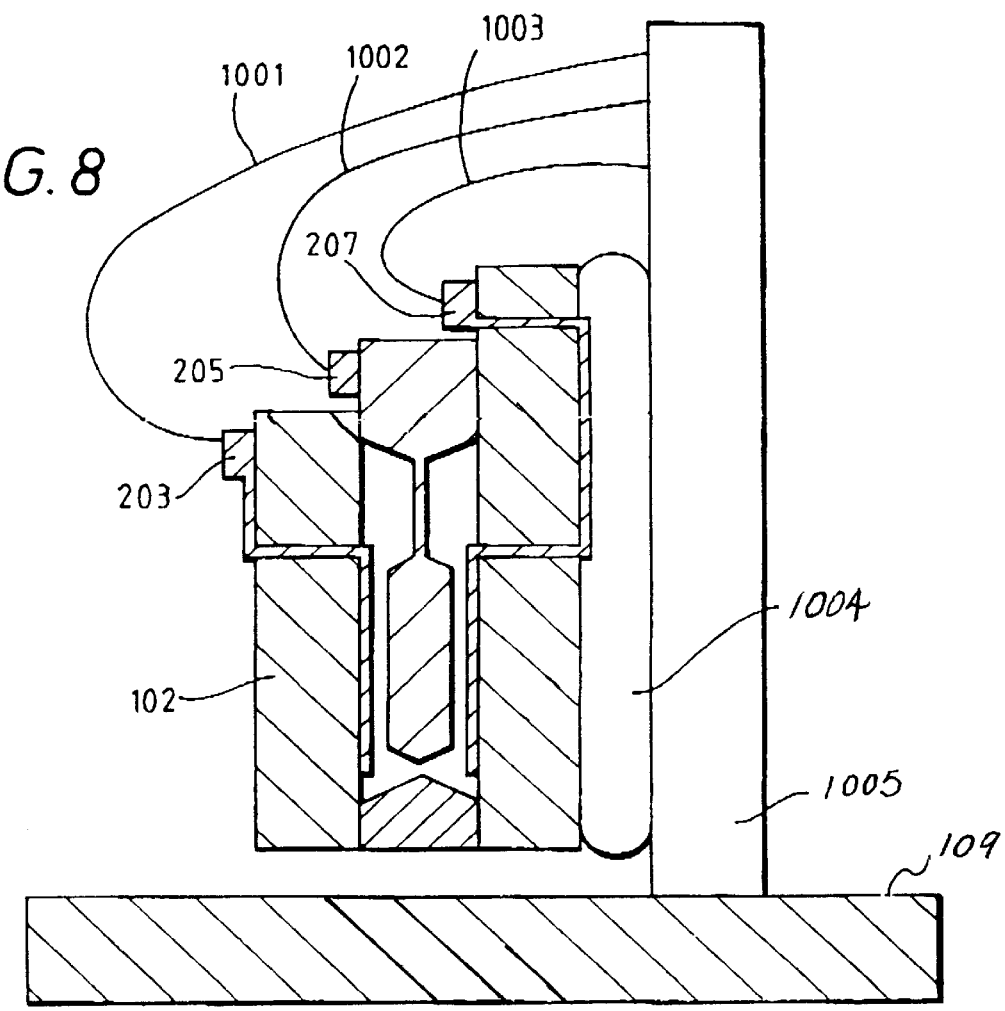
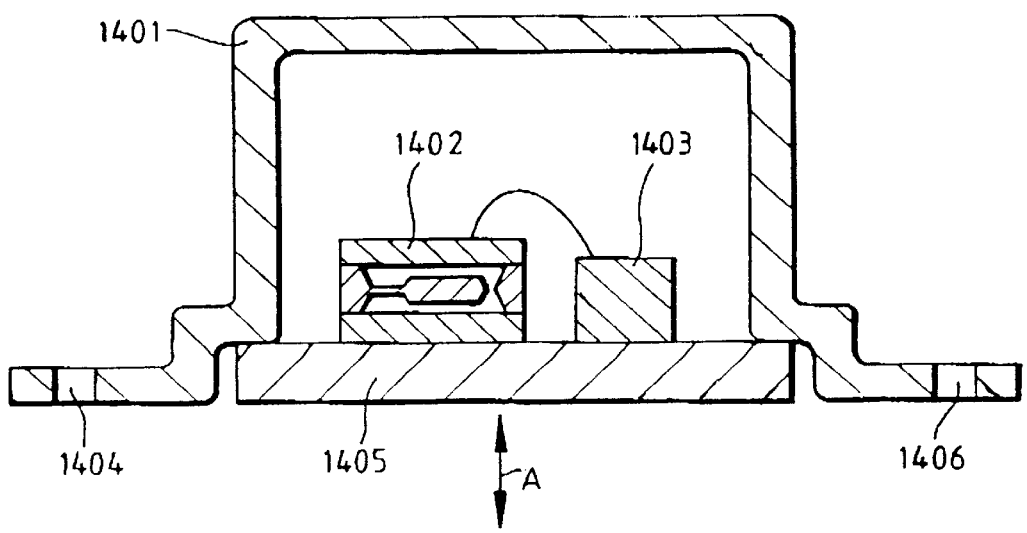

STRUCTURE FOR MOUNTING COMPONENTS

CROSS-REFERENCE TO RELATED APPLICATIONS

This application is a divisional of application Ser. No. 08/778,538, filed on Jan. 3, 1997 now U.S. Pat. No. 6,305,223 which in turn is a continuation of application Ser. No. 08/361,657, filed on Dec. 22, 1994 now abandoned.

FIELD OF THE INVENTION

The present invention relates to an acceleration sensor, and more particularly to an automobile air bag control apparatus using an acceleration sensor.

BACKGROUND ART

One known acceleration sensor formed by layering glass or silicon is described in JP-A-3-134570.

JP-B-4-55267 (equivalent to U.S. Pat. No. 4,679,434) discloses an acceleration sensor including a flat substrate having mounted thereon an acceleration detecting element and an electronic circuit for detecting a change in electrostatic capacitance of the acceleration detecting element. The substrate is mounted in a metal housing. The acceleration sensor is fixed in place by means of screws to be inserted through mounting holes formed through metal flanges in the housing.

The direction of acceleration to be detected by the acceleration sensor is perpendicular to the mounting surface of the acceleration sensor. Further, the use of the metal housing makes the acceleration sensor heavy. This structure results in various limitations on the mounting of the acceleration sensor in a system using the ensor.

In an air bag system, for example, a control unit of the air bag system is usually mounted in a horizontal direction of a vehicle, whereas the direction of acceleration to be detected by the acceleration sensor is the same as a longitudinal direction of the vehicle.

Accordingly, in such an application, because of the fact that the direction of acceleration to be detected by the acceleration sensor is perpendicular to the mounting surface of the acceleration sensor, it is necessary to mount the sensor perpendicular to the longitudinal direction of the vehicle. This necessitates complex mechanical arrangements for the mounting of the sensor.

Moreover, because of the relatively large weight of the acceleration sensor itself, the sensor is liable to mechanically resonate (which causes an error in detection of the acceleration).

JP-A-5-340963 discloses an acceleration sensor in which the acceleration detecting element is also mounted on a base plate such that the direction of acceleration to be detected is perpendicular to the base plate. The base plate is itself however mounted perpendicular to the metal base of the acceleration sensor housing, such that the direction of acceleration to be detected by the sensor is parallel to the mounting surface of the sensor. However, this construction still results in a complex and bulky device.

EP-B-0369352 discloses a capacitance-type accelerometer comprising three parallel silicon plates, the central one of which includes a movable electrode part. The plates are insulated from each other using thermal-oxide films in all areas between the plates except those adjacent the movable electrode. There is no discussion of a method of mounting the accelerometer.

It is an object of the present invention to provide an acceleration sensor which mitigates some of the above disadvantages.

SUMMARY OF THE INVENTION

In a first aspect the present invention provides an acceleration sensor including a base and an acceleration detection element of capacitance type mounted on the base. The acceleration detection element has a movable electrode mounted adjacent a fixed electrode such that acceleration of the sensor in a measurement direction causes the movable electrode to move relative to the fixed electrode. The element further has opposite ends in a direction perpendicular to the measurement direction, and the acceleration detection element is mounted on the base at a first one of the opposite ends.

The acceleration detection element being mounted at a first one of the opposite ends means that the first one of the ends is directed generally towards the base. The end need not necessarily contact the base and in some embodiments the end is separated from the base by bonding material, such as an elastomeric adhesive, used to bond the acceleration detection element to the base.

Thus, the acceleration detecting element of the acceleration sensor is arranged so that the direction of acceleration to be detected by the acceleration sensor is parallel to a mounting surface of the acceleration sensor. Accordingly, the direction of acceleration to be detected by the acceleration sensor mounted on the mounting surface is parallel to the surface, thereby making the mounting of the acceleration sensor easier.

Further, the acceleration detecting element may be airtightly sealed by a mounting surface or substrate on which the acceleration detecting element is mounted, and a cover mounted on the substrate so as to surround the acceleration detecting element, thereby reducing the weight of the acceleration sensor without use of a metal housing. Accordingly, even when the acceleration sensor is fixed to a printed board having a low mechanical rigidity, no resonance of the acceleration sensor occurs.

The element may comprise a movable electrode mounted between a pair of fixed electrodes, with the element preferably having at least one end face which is substantially parallel to the direction of acceleration detectable by motion of the movable electrode, wherein the element is mounted on the base such that the end or end face lies on the base. The end face may be separated from the base by e.g. a fixing medium such as an adhesive.

Preferably, the movable electrode is supported by a flexible beam which extends from the movable electrode towards the other of the opposite ends.

By locating the beam end of the movable electrode away from the base the effect of vibrations on the acceleration detection element are reduced.

Preferably, the element has a pair of end faces which are each substantially parallel to the direction of acceleration detectable by motion of the movable electrode. A first one of the pair of end faces is the most remote from the beam, and the element is mounted on the base such that the first end face lies on the base.

Preferably, the acceleration detection element includes at least one electrical connection terminal located at the other of the opposite ends.

Preferably the at least one electrical connection terminal for electrical connection to the acceleration detection element is located in an end region of the acceleration detection element remote from the end or face which lies on the plate. Preferably the sensor includes at least first and second electrical connection terminals for electrical connection to the movable electrode and the fixed electrode respectively, and possibly a third electrical connection terminal for connection to a second fixed electrode.

The above arrangements provide relatively easy access to the terminals and allow for easier connection of e.g. wires thereto.

The acceleration detection element may be attached to the base by elastomeric adhesive, such as silicone rubber. This provides a relatively secure attachment whilst also giving some insulation of the acceleration detection element from external vibrations.

Preferably, the base is a ceramic base such as a ceramic plate and the sensor further includes signal processing means mounted on the base, the signal processing means being electrically connected by electrical connection means to the acceleration detection element, and the signal processing means being adapted to convert electrical information output from the element into an electrical signal related to acceleration detected by the element.

Advantageously, the ceramic base includes therein or thereon the electrical connection means. In other words, the ceramic base may also be a circuit board having tracks or other circuit elements located thereon. Preferably, the electrical connection means connect the signal processing means to the movable electrode and the fixed electrode.

Preferably, the element includes at least first and second electrical connection terminals for electrical connection to the movable electrode and the fixed electrode respectively, and the terminals are connected using solder directly to the electrical connection means on the base.

In a second aspect, the present invention provides electrical apparatus including an acceleration sensor as described above mounted on a circuit board using mounting means, wherein the mounting means also provide electrical connection between the circuit board and the acceleration sensor.

In this way, a more compact packaging for the acceleration sensor included in the electrical apparatus may be provided. Such a packaging may, for example, be a leadless chip carrier.

Preferably, the acceleration sensor is mounted on the circuit board such that the base (e.g. a base plate) is substantially perpendicular to the circuit board. In this way the direction of acceleration detection may be chosen to be either parallel or perpendicular to the circuit board as required.

In one embodiment, the movable electrode comprises a first semiconductor layer which is mounted between first and second insulating layers, there being a pair of the fixed electrodes provided respectively on faces of the first and second insulating layers adjacent the movable electrode. The acceleration sensor further includes second and third semiconductor layers each respectively mounted on a face of the first and second insulating layers remote from the movable electrode, with each of the fixed electrodes being connected to a different one of the second and third semiconductor layers.

According to a third aspect, the present invention provides an acceleration sensor including an acceleration detection element mounted on a ceramic base, and signal processing means mounted on the base and electrically connected by electrical connection means to the acceleration detection element. The base includes electrical tracks being part of the electrical connection means and the signal processing means are adapted to convert electrical information output from the element to an electrical signal related to acceleration detected by the element.

In this aspect, the invention is applicable to sensors having acceleration elements of various different types, such as a strain gauge type and a piezoelectric type, but it is especially applicable to the capacitative type.

According to a fourth aspect, the present invention provides an automobile air bag control system including an acceleration sensor or electrical apparatus according to any of the above aspects.

BRIEF DESCRIPTION OF THE DRAWINGS

Embodiments of the invention will now be described by way of non-limitative examples with reference to the accompanying drawings. In the drawings:

FIG. 3 is a sectional view showing a first mounting structure of the acceleration detecting element of FIG. 2.

FIG. 4 is a sectional view showing a modified mounting structure of the acceleration detecting element of FIG. 2.

FIG. 7 is a sectional view showing another mounting structure of the acceleration detecting element of FIG. 2.

FIG. 8 is a sectional view showing yet another ounting structure of the acceleration detecting element of FIG. 2.

FIG. 11 is a cross section taken along the line A–A' in FIG. 10.

FIG. 12 is a sectional view of an acceleration sensor according to a fourth preferred embodiment of the present invention.

DETAILED DESCRIPTION OF EMBODIMENTS

Figure 1:
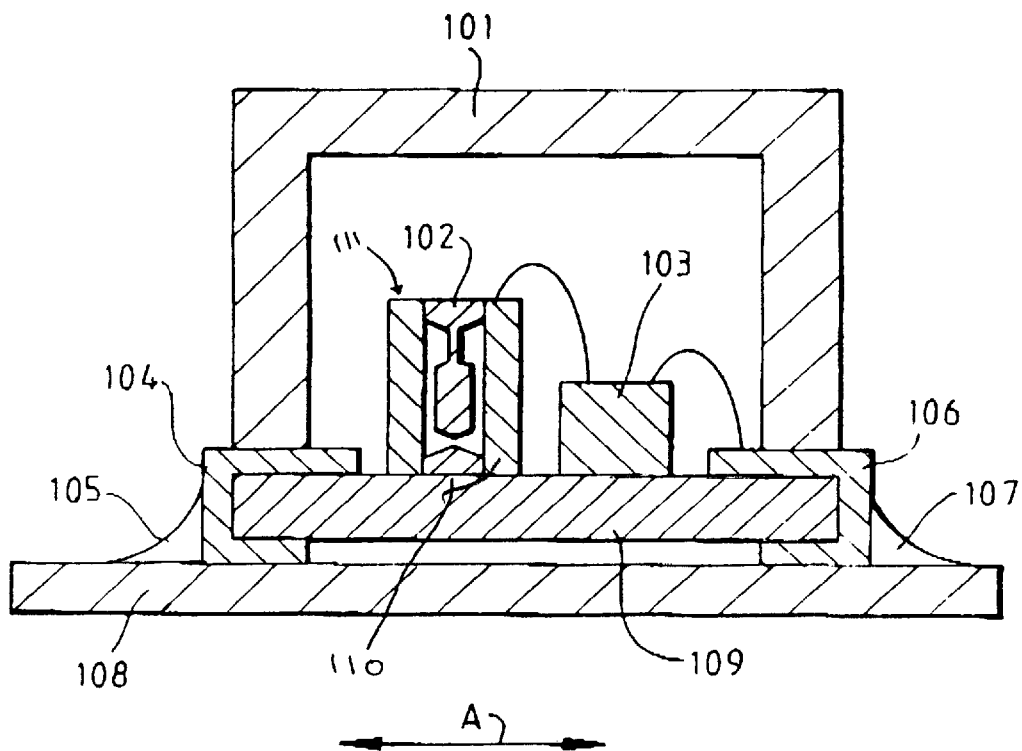
FIG. 1 is a general sectional view of an acceleration sensor according to a first preferred embodiment of the present invention.

An acceleration sensor according to a first preferred embodiment of the present invention will now be described with reference to FIG. 1. FIG. 1 is a general schematic sectional view of the acceleration sensor, according to the first preferred embodiment. This acceleration sensor includes a ceramic substrate or base plate 109, an acceleration detecting element 102 mounted on the ceramic substrate 109 for detecting acceleration having a direction parallel to the ceramic substrate 109 (shown as direction of arrow A), an electronic circuit 103 (or signal processing means) mounted on the ceramic substrate 109 for converting information output from the acceleration detecting element 102 to an electric signal according to the acceleration, and a ceramic cover 101 bonded to the ceramic substrate 109 to thereby airtightly seal the acceleration detecting element 102 and the electronic circuit 103.

The acceleration detection element 102 has opposite ends 110 and 111 in a direction perpendicular to the measurement direction A. The acceleration detection element is mounted on the base 109 at a first one 110 of the opposite ends.

The wiring between the electronic circuit 103 and the outside of the acceleration sensor is effected by conductor patterns (or tracks) 104 and 106 printed on the ceramic substrate 109. The conductor patterns 104 and 106 are used also as soldering pads for fixing the ceramic substrate 109 to a printed board 108 and for effecting wiring to the printed board 108.

That is, as shown in FIG. 1, solders 105 and 107 are provided between the conductor pattern 104 and the printed board 108 and between the conductor pattern 106 and the printed board 108, respectively, thereby effecting the fixation of the ceramic substrate 109 to the printed board 108 and the wiring to the printed board 108.

Figure 2:
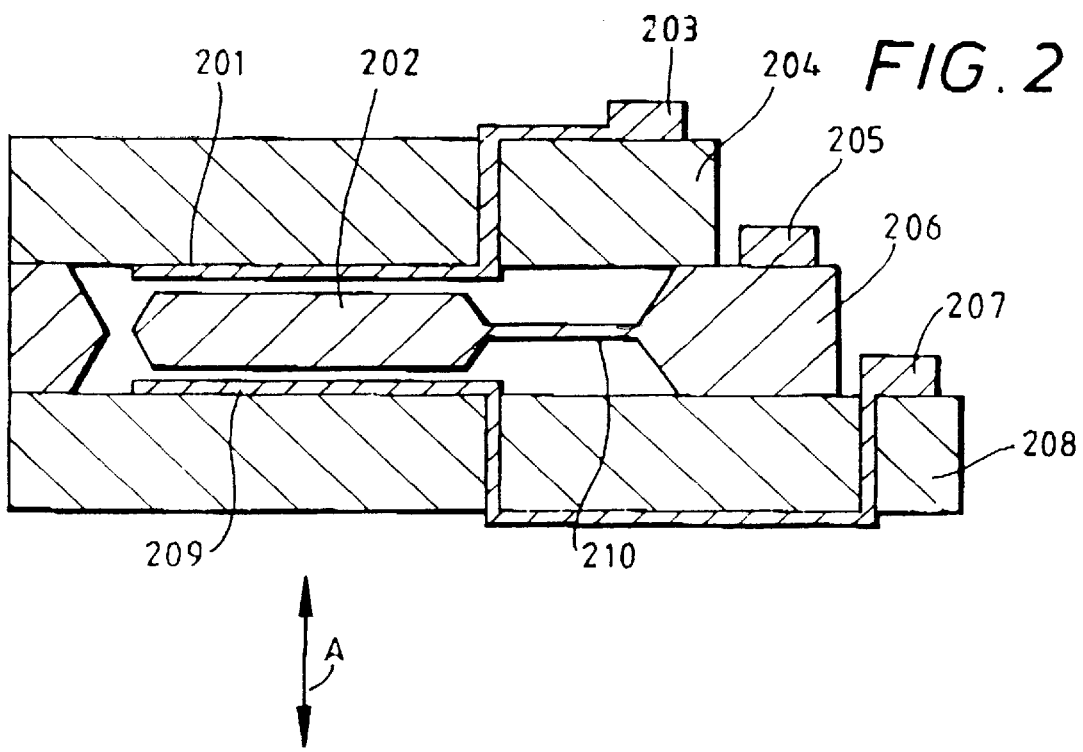
FIG. 2 is a sectional view in more detail of an acceleration detecting element in the acceleration sensor of FIG. 1.

An acceleration detecting element formed by layering glass or silicon will now be described with reference to FIG. 2. FIG. 2 shows a sectional structure of the acceleration detecting element adapted to detect acceleration in the direction of arrow A. The acceleration detecting element is constructed of glass layers 204 and 208 and a silicon layer 206. The central silicon layer 206 is formed with a beam 210 and a movable electrode 202 supported by the beam 210 and adapted to move according to acceleration.

The upper and lower glass layers 204 and 208 are provided with fixed electrodes 201 and 209, respectively, opposed to the movable electrode 202. The fixed electrodes 201 and 209 and the movable electrode 202 are connected to pads 203, 207, and 205, respectively, to effect electrical connection to the outside.

Accordingly, when acceleration acts on the acceleration detecting element in a direction of stacking of the layers 204, 206, and 208, the movable electrode 202 is moved in this direction of acceleration to be detected. As a result, an electrostatic capacity or capacitance between the movable electrode 202 and the fixed electrode 201 is changed, and an electrostatic capacity between the movable electrode 202 and the fixed electrode 209 is also changed. Thus, such changes in electrostatic capacity are detected to thereby obtain an output according to the acceleration.

A first mounting structure of an acceleration detecting element 102 according to the present invention will now be described with reference to FIG. 3. The acceleration detecting element 102 shown in FIG. 3 is the same as the acceleration detecting element shown in FIG. 2. To ensure parallelism and adhesive strength of the acceleration detecting element 102 in fixing the acceleration detecting element 102 to a ceramic substrate 109, the length of the acceleration detecting element 102 in its layering direction is increased to increase an area of a bonding surface of the acceleration detecting element 102 to be bonded to the ceramic substrate 109. The bonding surface of the acceleration detecting element 102 is bonded through an elastomeric adhesive e.g. silicone rubber 504 to the ceramic substrate 109. The bonding surface of the acceleration detecting element 102 is selected so that the beam 210 is farthest from the bonding surface, thereby reducing any influence on the acceleration detecting element 102 due to a stress acting from the ceramic substrate 109. The wiring from the acceleration detecting element 102 to the ceramic substrate 109 is effected by wire bonding of gold wires 501, 502, and 503 to the pads 203, 205, and 207, respectively.

A second mounting structure of an acceleration detecting element according to the present invention will now be described with reference to FIG. 4. FIG. 4 is a sectional view of the acceleration sensor according to the present invention. This acceleration sensor includes a ceramic substrate 109, an acceleration detecting element 102 mounted on the ceramic substrate 109 for detecting acceleration having a direction parallel to the ceramic substrate 109, an electronic circuit 604 mounted on the ceramic substrate 109 for converting information output from the acceleration detecting element 102 to an electric signal according to the acceleration, and a ceramic cover (not shown) bonded to the ceramic substrate 109 to thereby airtightly seal the acceleration detecting element 102 and the electronic circuit 604. The wiring between the electronic circuit 604 and the outside of the acceleration sensor is effected by a conductor pattern printed on the ceramic substrate 109. Further, the conductor pattern may be connected through a gold wire to the ceramic cover by wire bonding.

Another form of an acceleration detecting element according to the present invention will now be described with reference to FIG. 5. First, the structure of the acceleration detecting element shown in FIG. 5 will be described. The acceleration detecting element is constructed of silicon layers 802, 805, and 808 and glass layers 803 and 806. The central silicon layer 805 is formed with a movable electrode 810 adapted to move according to acceleration and a beam 809 for supporting the movable electrode 810. The glass layers 803 and 806 are provided with fixed electrodes 811 and 812, respectively, opposed to the movable electrode 810.

Accordingly, when acceleration acts on the acceleration detecting element in a direction of stacking of the layers, the movable electrode 810 is moved in this direction of acceleration to be detected. As a result, an electrostatic capacity between the movable electrode 810 and the fixed electrode 811 and an electrostatic capacity between the movable electrode 810 and the fixed electrode 812 are changed. Thus, such changes in electrostatic capacity are detected to thereby obtain an output according to the acceleration.

The wiring from the fixed electrodes 811 and 812 to the outside is effected by the silicon layers 802 and 808 and pads or electrical connection terminals 801 and 807 provided thereon. The wiring from the movable electrode 810 to the outside is effected by a pad 804 provided on the silicon layer 805.

The acceleration detecting element is fixed to a ceramic substrate 109 by soldering of the pads directly to the substrate using solder 814, 815 and 816. Thus the ceramic substrate is also used as a circuit board.

Further, the length of the acceleration detecting element in its layering direction is increased to thereby increase an area of a bonding surface and accordingly increase a bonding strength of the acceleration detecting element to the ceramic substrate 109.

In addition, the bonding surface of the acceleration detecting element is selected so that the beam 809 is farthest from the bonding surface, thereby reducing an influence of stress acting from the ceramic substrate 109 to the acceleration detecting element.

Figure 5:
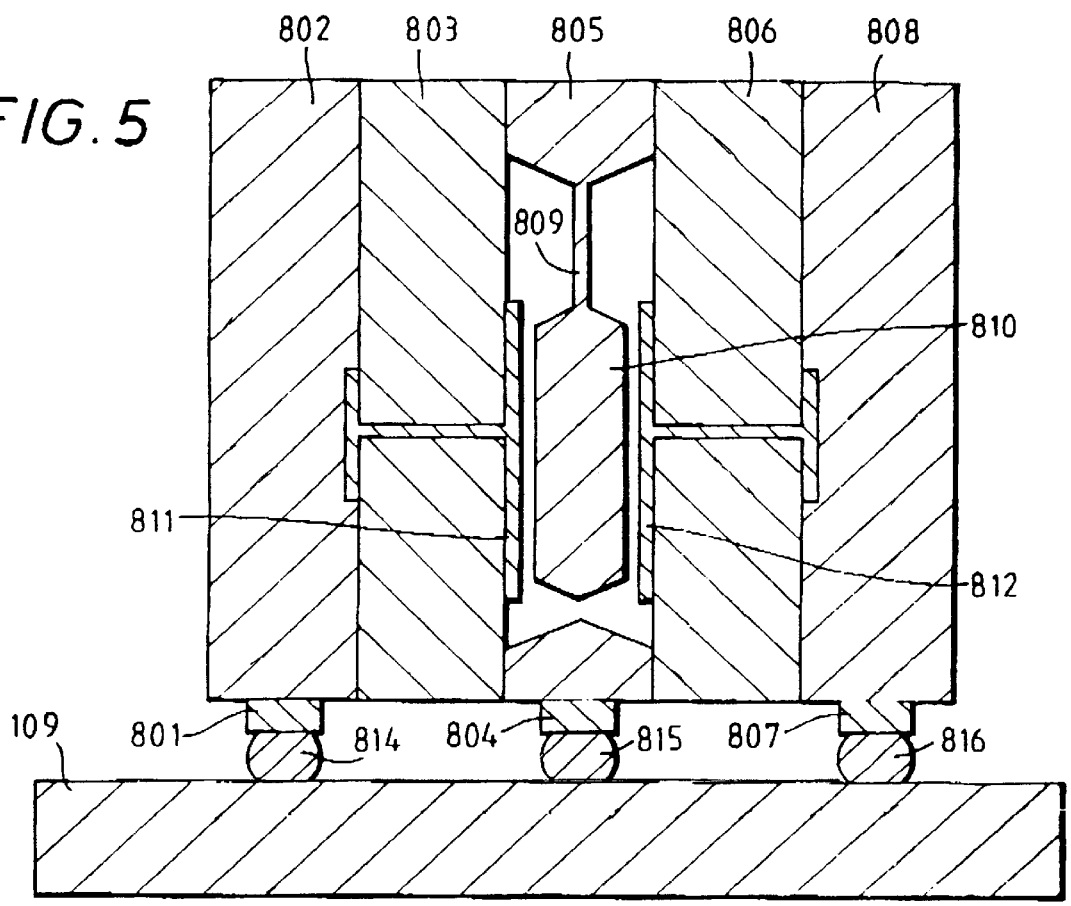
FIG. 5 is a sectional view showing another form of the acceleration detecting element and its mounting structure, which can be used in the sensor of FIG. 1.
Figure 6:
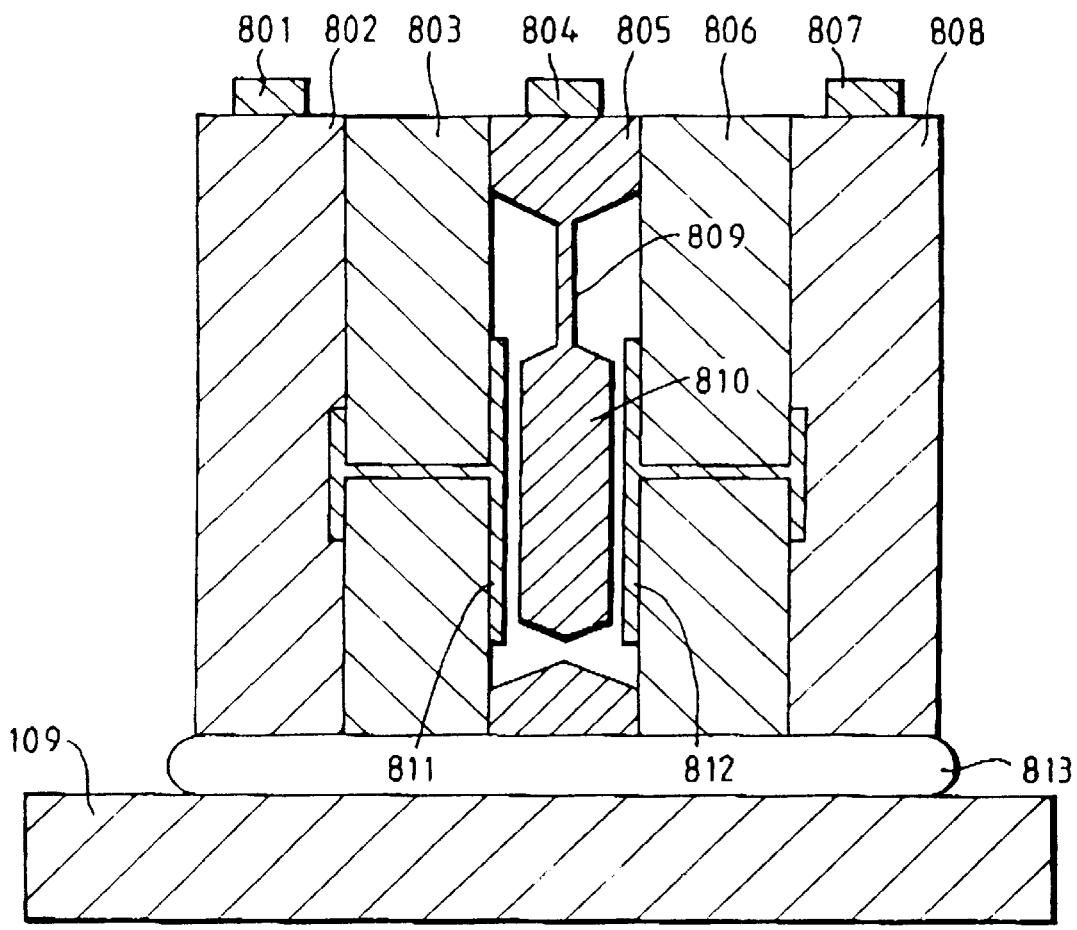
FIG. 6 is a sectional view showing another configuration and mounting structure of the acceleration detecting element of FIG. 5.

FIG. 6 shows a mounting structure for an acceleration detecting element similar to that shown in FIG. 5. However in the embodiment illustrated in FIG. 6. the electrical connection terminals 801, 804 and 807 are provided on the surfaces of the silicon layers 802, 805 and 808 on the face of the element remote from the ceramic plate 109. The acceleration detecting element is fixed to the ceramic plate 109 using silicone rubber adhesive 813 and, although not shown, wiring from the acceleration detecting element to the ceramic plate 109 is effected by a wire bonding of gold wires to the pads 801, 804 and 807.

A fifth mounting structure of an acceleration detecting element 102 according to the present invention will now be described with reference to FIG. 7. The acceleration detecting element 102 shown in FIG. 7 is the same as the acceleration detecting element shown in FIG. 2. The acceleration detecting element is bonded through silicone rubber 906 to a ceramic substrate 907. Conductor patterns 904 and 908 formed on the ceramic substrate 907 are connected through solders 905 and 909 to a ceramic substrate 109. Thus, the acceleration detecting element 102 is fixed to the ceramic substrate 109. The wiring from the acceleration detecting element 102 to the ceramic substrate 109 is effected by wire bonding of gold wires 901, 902, and 903 from pads 203, 205, and 207 to the conductor pattern 904 and by the solder 905 from the conductor pattern 904 to the ceramic substrate 109.

A sixth mounting structure of an acceleration detecting element 102 according to the present invention will now be described with reference to FIG. 8. The acceleration detecting element 102 shown in FIG. 8 is the same as the acceleration detecting element shown in FIG. 2. In this mounting structure, a vertical member 1005 is provided on a ceramic substrate 109, and the acceleration detecting element 102 is bonded through silicone rubber 1004 to the vertical member 1005. Gold wires 1001, 1002, and 1003 are connected between pads 203, 205, and 207 and the vertical member 1005. According to this mounting structure, the provision of the vertical member 1005 standing on the ceramic substrate 109 improves the vertical accuracy of mounting of the acceleration detecting element 102.

Figure 9:
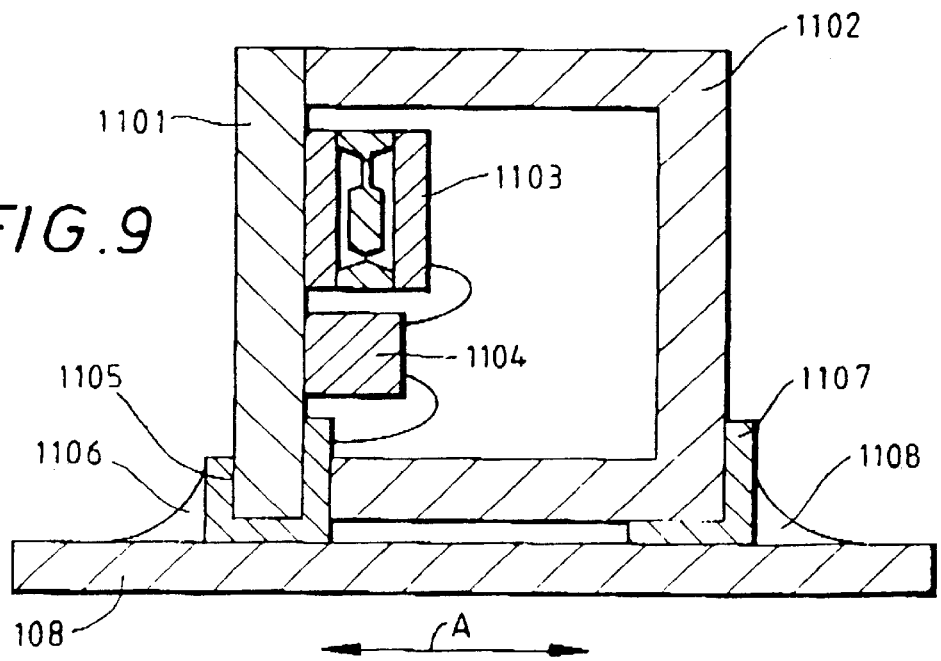
FIG. 9 is a sectional view of an acceleration sensor according to a second preferred embodiment of the present invention.

An acceleration sensor according to a second preferred embodiment of the present invention will now be described with reference to FIG. 9. FIG. 9 is a sectional view of the acceleration sensor according to the second preferred embodiment, adapted to detect acceleration in the direction of arrow A. This acceleration sensor includes a ceramic substrate 1101, an acceleration detecting element 1103 mounted on the ceramic substrate 1101 for detecting acceleration having a direction perpendicular to the ceramic substrate 1101, an electronic circuit 1104 mounted on the ceramic substrate 1101 for converting information output from the acceleration detecting element 1103 to an electric signal according to the acceleration, and a ceramic cover 1102 bonded to the ceramic substrate 1101 to thereby airtightly seal the acceleration detecting element 1103 and the electronic circuit 1104.

Electrical connection between the electronic circuit 1104 and the outside of the acceleration sensor is effected by a conductor pattern 1105 printed on the ceramic substrate 1101. The conductor pattern 1105 and another conductor pattern 1107 formed on the ceramic cover 1102 are used also as soldering pads for fixing the ceramic substrate 1101 and the ceramic cover 1102 to a printed board 108. That is, as shown in FIG. 9, solders 1106 and 1108 are provided between the conductor pattern 1105 and the printed board 108 and between the conductor pattern 1107 and the printed board 108, respectively.

Figure 10:
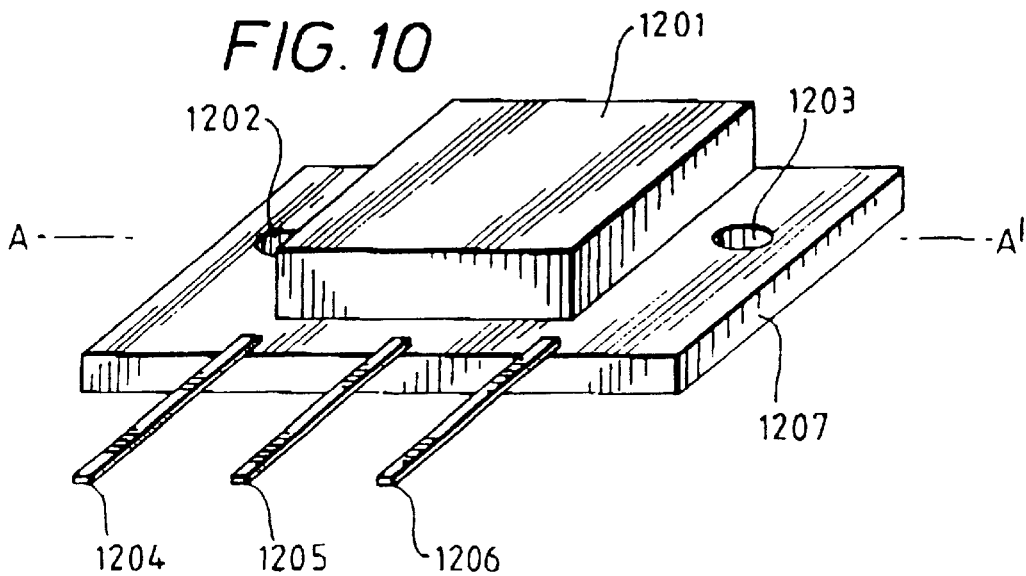
FIG. 10 is a perspective view of an acceleration sensor according to a third preferred embodiment of the present invention.

An acceleration sensor according to a third preferred embodiment of the present invention will now be described with reference to FIGS. 10 and 11. FIG. 10 is a perspective view of the acceleration sensor according to the third preferred embodiment, and FIG. 11 is a cross section taken along the line A–A' in FIG. 10. This acceleration sensor includes a ceramic substrate 1207, an acceleration detecting element 1301 mounted on the ceramic substrate 1207 for detecting acceleration having a direction perpendicular to the ceramic substrate 1207, an electronic circuit 1302 mounted on the ceramic substrate 1207 for converting information output from the acceleration detecting element 1301 to an electric signal according to the acceleration, and a ceramic cover 1201 bonded to the ceramic substrate 1207 to thereby airtightly seal the acceleration detecting element 1301 and the electronic circuit 1302.

The acceleration sensor is adapted to be mounted on a control unit of an air bag system or the like by using mounting holes 1202 and 1203 formed through the ceramic substrate 1207 and the sensor detects acceleration in the direction of arrow A. Further, leads 1204, 1205, and 1206 are mounted on the ceramic substrate 1207 to effect easy wiring to external equipment.

An acceleration sensor according to a fourth preferred embodiment of the present invention will now be described with reference to FIG. 12. FIG. 12 is a sectional view of the acceleration sensor according to the fourth preferred embodiment adapted to detect acceleration in the direction of arrow A. This acceleration sensor includes a ceramic substrate 1405, an acceleration detecting element 1402 mounted on the ceramic substrate 1405 for detecting acceleration having a direction perpendicular to the ceramic substrate 1405, an electronic circuit 1403 mounted on the ceramic substrate 1405 for converting information output from the acceleration detecting element 1402 to an electric signal according to the acceleration, and a metal cover 1401 bonded to the ceramic substrate 1405 to thereby airtightly seal the acceleration detecting element 1402 and the electronic circuit 1403. The acceleration sensor is adapted to be mounted on a side surface of a control unit of an air bag system or the like by using mounting holes 1404 and 1406 formed through the metal cover 1401.

Figure 13:
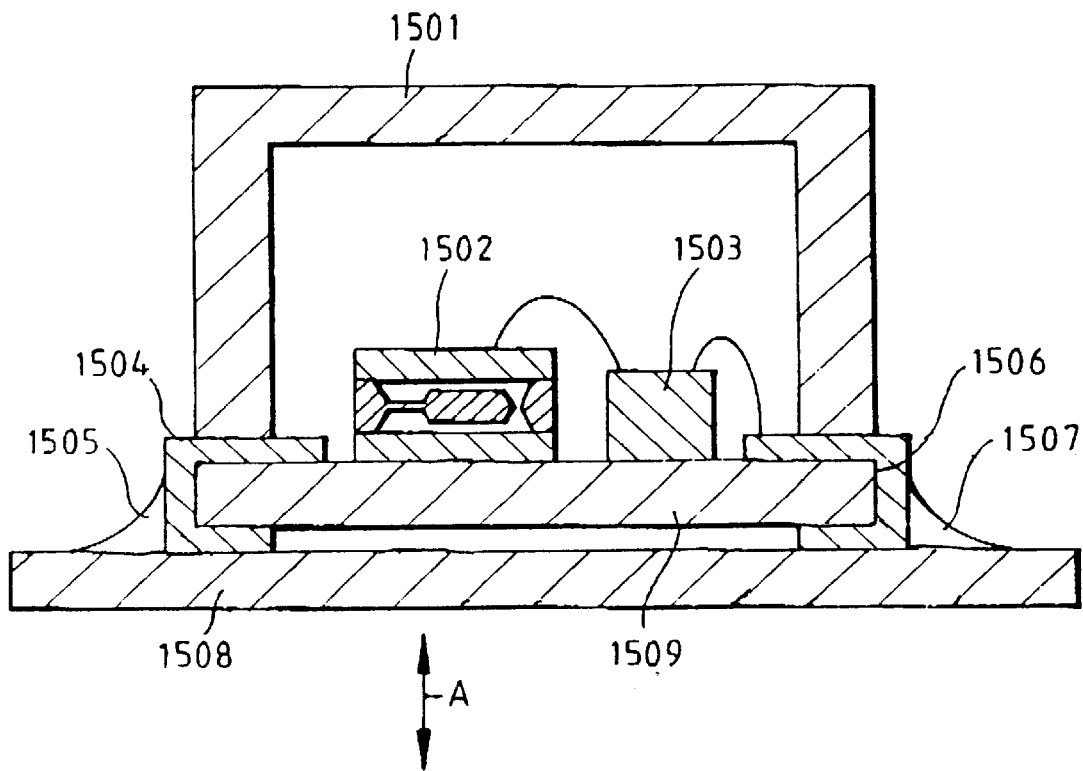
FIG. 13 is a sectional view of an acceleration sensor according to a fifth preferred embodiment of the present invention.

An acceleration sensor according to a fifth preferred embodiment of the present invention will now be described with reference to FIG. 13. FIG. 13 is a sectional view of the acceleration sensor according to the fifth preferred embodiment. This acceleration sensor includes a ceramic substrate 1509, an acceleration detecting element 1502 mounted on the ceramic substrate 1509 for detecting acceleration having a direction perpendicular to the ceramic substrate 1509, an electronic circuit 1503 mounted on the ceramic substrate 1509 for converting information output from the acceleration detecting element 1502 to an electric signal according to the acceleration, and a ceramic cover 1501 bonded to the ceramic substrate 1509 to thereby airtightly seal the acceleration detecting element 1502 and the electronic circuit 1503.

The acceleration sensor is mounted on a printed board 1508 by fixing the ceramic substrate 1509 through conductor patterns 1504 and 1506 formed on the ceramic substrate 1509 and solders 1505 and 1507 to the printed board 1508.

The conductor patterns 1504 and 1506 are used also as wiring means for wiring the electronic circuit 1503 to the printed board 1508.

In the acceleration sensor according to this preferred embodiment, a mounting surface of the acceleration sensor is perpendicular to the direction of acceleration to be detected (arrow A). Accordingly, the acceleration sensor can be surface-mounted on any systems as applied to control vibration of a vehicle, e.g. other than an air bag system.

A triaxial acceleration sensor according to the present invention will now be described with reference to FIG. 14. This triaxial acceleration sensor includes a ceramic substrate 1604 and three acceleration detecting elements 1601, 1602, and 1603 mounted on the ceramic substrate 1604 so that the directions of accelerations to be detected by the acceleration detecting elements 1601, 1602, and 1603 are perpendicular to one another (shown by arrows D, B and C respectively).

Figure 14:
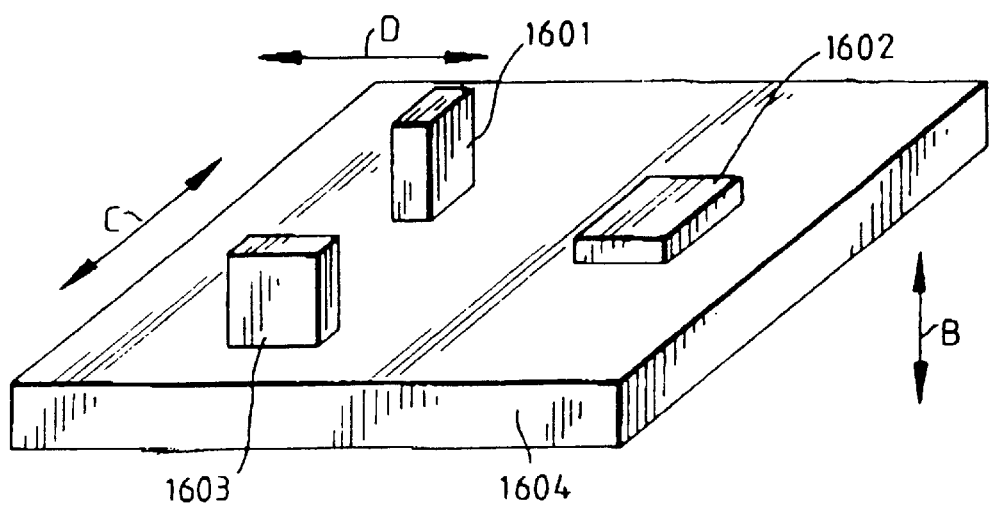
FIG. 14 is a perspective view of a triaxial acceleration sensor according to the present invention.

Although not shown in FIG. 14, the triaxial sensor may also include an electronic circuit and a ceramic cover. The acceleration detecting elements 1601, 1602, and 1603 detect acceleration in mutually perpendicular directions and the electronic circuit converts information output from the acceleration detecting elements 1601, 1602, and 1603 to electric signals, thereby detecting acceleration in any of the three perpendicular directions.

Figure 15:
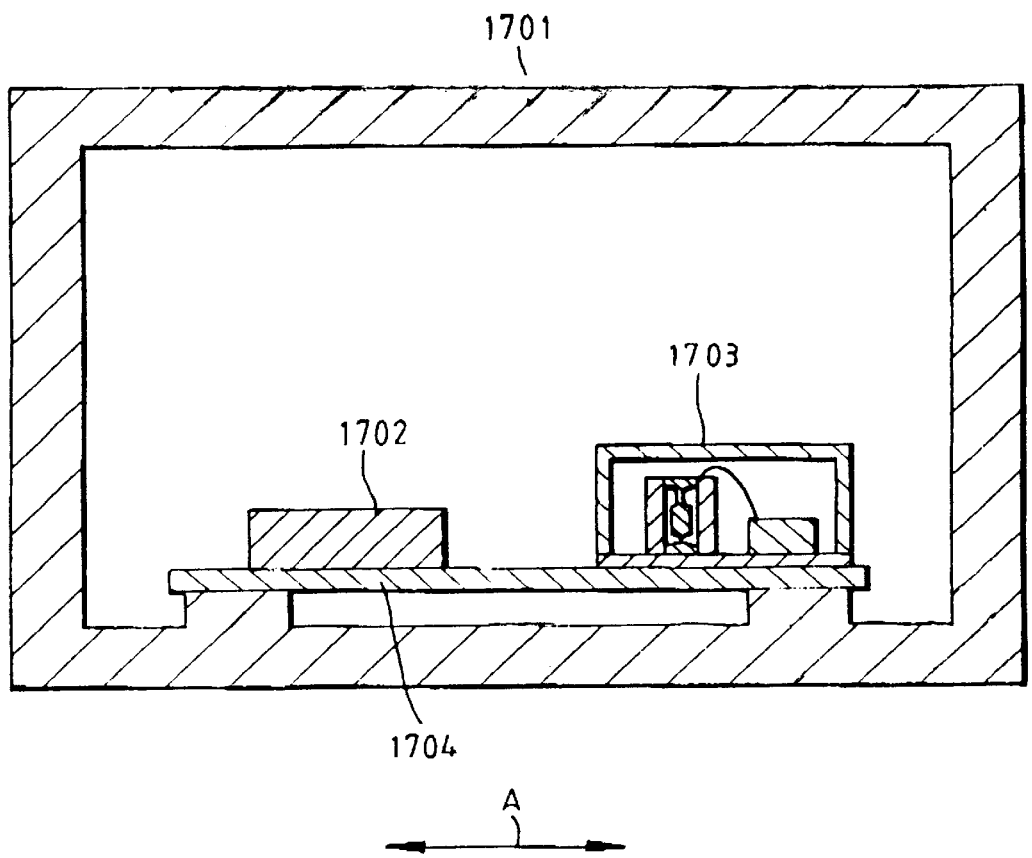
FIG. 15 is a sectional view of a control unit of an air bag system employing an acceleration sensor according to an embodiment of the present invention.

An air bag system employing the acceleration sensor according to the present invention will now be described with reference to FIGS. 15 and 16. FIG. 15 is a sectional view of a control unit of the air bag system showing direction of acceleration detection by arrow A, and FIG. 16 is a block diagram of the air bag control system.

The air bag system is constructed of a case 1701 and a printed board 1704 mounted in the case 1701. An acceleration sensor 1703 and an electronic circuit 1702 are mounted on the printed board 1704. The air bag system is characterized in that the acceleration sensor 1703 is surface-mounted on the printed board 1704.

Furthermore, the acceleration sensor 1703 is fixed at a position near a fixed portion of the printed board 1704 fixed to the case 1701, so as to reduce any influence due to resonance of the printed board 1704.

Figure 16:
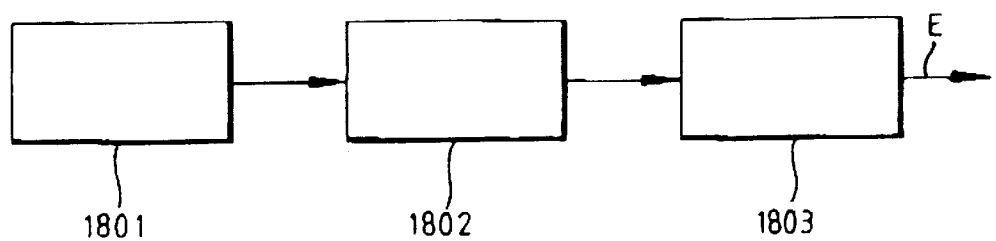
FIG. 16 is a block diagram of an air bag control system.

Referring to FIG. 16, the air bag system is composed of an acceleration sensor 1801 for detecting acceleration of collision of a vehicle, a microcomputer 1802 for computing the magnitude of the collision from an output from the acceleration sensor 1801 and determining whether or not an air bag should be expanded, and a drive circuit 1803 for amplifying an output from the microcomputer 1802 to drive the air bag (output E).

Although the acceleration sensors herein described with reference to the drawings are of an electrostatic capacitance type, any other types of acceleration sensor such as a strain gauge type or a piezoelectric type may be used in the invention where appropriate.

While the invention has been illustrated by specific embodiments, it is not limited to those embodiments, and extends to all modifications and improvements in accordance with the concept of the invention.

What is claimed is:

1. A structure for mounting electronic components comprising:

a housing including a ceramic substrate;

conductor patterns formed on the housing; and electronic components including an acceleration detector which is bonded on the inside of the housing and is connected to the conductor patterns, wherein;

the housing is composed of a ceramic substrate and a ceramic cover.

2. A structure for mounting a housing containing electronic components therein comprising:

a housing;

conductor patterns formed on the housing;

a gold connection on a surface of the conductor patterns; and a base board for mounting the housing thereon, the housing being soldered on the base board and electrically connected thereto at portions where the conductor patterns are formed.

3. A structure for mounting a housing containing electronic components therein according to claim 2, wherein said gold connection is a gold film having a thickness of more than 0.07 $\mu$m.

4. A structure for mounting a housing containing electronic components therein according to claim 3, wherein the conductor patterns further include a base film of silver or a silver alloy on the housing, the gold film being formed on the base film.

5. A structure for mounting a housing containing electronic components therein according to claim 3, wherein the electronic components comprise an acceleration detector and an electronic circuit generating an electrical signal in accordance with the acceleration detected by said acceleration detector, wherein said electronic circuit is electrically connected to said conductor patterns and is placed in conduction with said base board through said conductor patterns.

6. A structure for mounting a housing containing electronic components therein according to claim 5, wherein a processing circuit is provided on said base board to process said electrical signal and said processing circuit is electrically connected to said electronic circuit through said conductor patterns.

7. A structure for mounting a housing containing electronic components therein according to claim 6, wherein said acceleration detector comprises a weight and a beam supporting said weight formed on a silicon plate.

8. A structure for mounting a housing containing electronic components therein according to claim 7, wherein said housing is soldered on said base board so that said silicon plate is substantially perpendicular to said base board.

9. A structure for mounting a housing containing electronic components according to claim 5, wherein said housing is composed of ceramic and said acceleration detector and said electronic circuit are hermetically sealed internally of said housing.

10. A structure for mounting a housing containing electronic components according to claim 5, wherein said housing is composed of a ceramic substrate and a ceramic cover.

* * * * *